(12) United States Patent
Mo

(10) Patent No.: US 12,411,190 B2
(45) Date of Patent: Sep. 9, 2025

(54) PRODUCTION PROCESS OF BASE WITH ELECTRONIC COMPONENT

(71) Applicant: SUZHOU GYZ ELECTRONIC TECHNOLOGY CO., LTD., Jiangsu (CN)

(72) Inventor: Couquan Mo, Kunshan (CN)

(73) Assignee: SUZHOU GYZ ELECTRONIC TECHNOLOGY CO., LTD., Kunshan (CN)

( * ) Notice: Subject to any disclaimer, the term of this patent is extended or adjusted under 35 U.S.C. 154(b) by 0 days.

(21) Appl. No.: 18/642,056

(22) Filed: Apr. 22, 2024

(65) Prior Publication Data

US 2024/0272247 A1    Aug. 15, 2024

Related U.S. Application Data

(62) Division of application No. 17/276,726, filed as application No. PCT/CN2019/090830 on Jun. 12, 2019, now Pat. No. 12,013,448.

(30) Foreign Application Priority Data

Sep. 25, 2018    (CN) .......................... 201811114105.4

(51) Int. Cl.
*G01R 33/00*    (2006.01)
*G01R 33/07*    (2006.01)
(Continued)

(52) U.S. Cl.
CPC ......... *G01R 33/07* (2013.01); *H02K 41/0354* (2013.01); *H04M 1/0227* (2013.01); *H04M 1/0264* (2013.01)

(58) Field of Classification Search
CPC ...................................................... G01R 33/07
(Continued)

(56) References Cited

U.S. PATENT DOCUMENTS 5,798,570 A * 8/1998 Watanabe ........... H01L 23/4334
257/713
5,905,301 A   5/1999 Ichikawa et al.
(Continued)

FOREIGN PATENT DOCUMENTS

CN    1290963 A    4/2001
CN    1649472 A    8/2005
(Continued)

OTHER PUBLICATIONS

Decision to Grant a Patent from related Japanese Patent Application No. 2021-507054, dated Jun. 20, 2022, 5 pages.
(Continued)

*Primary Examiner* — Stanley Tso
(74) *Attorney, Agent, or Firm* — GREENBLUM & BERNSTEIN, P.L.C.

(57) ABSTRACT

A production process of a base with an electronic component includes stamping a metallic circuit with a plurality of branch circuits; integrally forming a first plastic part by injection molding on the metallic circuit so as to form a first semi-finished product; connecting the electronic component with the branch circuit respectively on the first semi-finished product so as to form a second semi-finished product; and integrally forming a second plastic part by injection molding on the second semi-finished product; a step of bending the metallic circuit of the second semi-finished product so as to transfer the first plastic part and the electronic component from a first horizontal position to a second vertical position.

18 Claims, 6 Drawing Sheets

(51) Int. Cl.
  *H02K 41/035* (2006.01)
  *H04M 1/02* (2006.01)
(58) Field of Classification Search
  USPC ........................................................ 455/556
  See application file for complete search history.

(56) References Cited

U.S. PATENT DOCUMENTS

| | | | |
|---|---|---|---|
| 6,469,386 | B1 | 10/2002 | Lee et al. |
| 2003/0001682 | A1 | 1/2003 | Biernacki |
| 2007/0057665 | A1* | 3/2007 | Borst .................. G01D 11/245 324/207.2 |
| 2020/0090970 | A1* | 3/2020 | Liao .................. H01L 21/67333 |
| 2020/0244852 | A1 | 7/2020 | Wang et al. |
| 2020/0260011 | A1 | 8/2020 | Sasaki et al. |

FOREIGN PATENT DOCUMENTS

| | | |
|---|---|---|
| CN | 101349794 A | 1/2009 |
| CN | 201323617 Y | 10/2009 |
| CN | 103474859 A | 12/2013 |
| CN | 104898348 A | 9/2015 |
| CN | 108989511 A | 12/2018 |
| EP | 1170110 A1 | 1/2002 |
| JP | S62176663 A | 8/1987 |
| JP | H0180952 U | 5/1989 |
| JP | H0992766 A | 4/1997 |
| JP | 2000012762 A | 1/2000 |
| JP | 2001110971 A | 4/2001 |
| JP | 2001-168259 A | 6/2001 |
| JP | 2009025377 A | 2/2009 |
| JP | 2015169850 A | 9/2015 |

OTHER PUBLICATIONS

Non-final Office Action from related U.S. Appl. No. 17/276,726, dated Dec. 7, 2023, 19 pages.
Chinese Office Action dated Sep. 22, 2020 issued in corresponding Patent Application No. 201811114091.6 (6 pages).
Japanese Office Action dated May 9, 2022 issued in corresponding Patent Application No. 2021-507054 (3 pages).
International Search Report dated Sep. 2, 2019 issued in corresponding patent application PCT/CN2019/090830 (3 pages).

* cited by examiner

PRODUCTION PROCESS OF BASE WITH ELECTRONIC COMPONENT

CROSS-REFERENCE OF THE RELATED APPLICATIONS

This application is a divisional application of U.S. patent application Ser. No. 17/276,726, filed on Mar. 16, 2021, which is a National Phase of International Application No. PCT/CN2019/090830, filed on Jun. 12, 2019, which claims priority to Chinese Patent Application No. 201811114105.4, filed on Sep. 25, 2018, the contents of which are incorporated herein by reference in their entireties.

TECHNICAL FIELD

The present disclosure relates to the field of electronic components, for example to a base with an electronic component and a voice coil motor.

BACKGROUND

The base with Hall element in the voice coil closed-loop motor of mobile phone camera module includes the Hall element, a flexible printed circuit board (FPC) and a plastic shell. The Hall element is welded on the FPC, and the whole of the Hall element and the FPC is embedded in the plastic shell. The production cost of the FPC in the base with the above structure is high, which leads to a high overall cost of the base. In addition, in the production process of the base, the Hall element is welded on the FPC, and it is further necessary to assemble the FPC with the Hall element to the plastic shell of the base, which increases the assembly steps and reduces the work efficiency.

Based on the above problems, there is a need for a base with an electronic component and a voice coil motor, which can solve the problems of complex process, low production efficiency and high production cost in related technologies.

SUMMARY

The present disclosure provides a base with an electronic component and a voice coil motor to solve the problems of complex process, low production efficiency and high production cost in the related technologies.

The present disclosure provides a base with an electronic component, the base includes:
  the electronic component;
  a metallic circuit connected to the electronic component and including a plurality of branch circuits, wherein first ends of the plurality of branch circuits and a plurality of pins of the electronic component are connected in a one-to-one correspondence;
  a first plastic part located on a position where the metallic circuit and electronic component are connected, and configured to connect all the branch circuits of the metallic circuit into one body and limit each branch circuit of the metallic circuit; and
  a second plastic part wrapped on the metallic circuit, wherein second ends of each branch circuit of the metallic circuit away from the electronic component extends out of the second plastic part.

In an embodiment, the first plastic part includes a plurality of positioning assemblies configured to limit the first end of each branch circuit connected to the electronic component in at least three different directions.

In an embodiment, the first plastic part includes a plurality of positioning assemblies connected to the plurality of branch circuits in a one-to-one correspondence, and each positioning assembly is configured to limit the first end of the corresponding branch circuit connected to the electronic component in at least three different directions.

In an embodiment, each positioning assembly includes at least three limiting blocks, and different limiting blocks abut against different positions on the corresponding branch circuit.

In an embodiment, the metallic circuit includes a metal substrate and a protective layer, the plurality of branch circuits are made of the metal substrate, and the protective layer covers an outer surface of the metal substrate.

In an embodiment, the protective layer includes an anti-oxidation layer, and a flux layer that covers an outside of the anti-oxidation layer.

In an embodiment, the first plastic part is integrally formed with the metallic circuit by injection molding.

In an embodiment, the second plastic part is integrally formed with the metallic circuit by injection molding.

In an embodiment, the metallic circuit is stamped from a plate material.

In an embodiment, the electronic component and the metallic circuit are welded by Surface Mount Technology (SMT).

The present disclosure further provides a voice coil motor including the above-mentioned base with the electronic component, and the electronic component is a Hall element.

In the base with the electronic component provided by the present disclosure, the FPC is replaced by the metallic circuit, so that there is no need to produce FPC, which simplifies the production process of the base and reduces the material cost.

Figure 1:
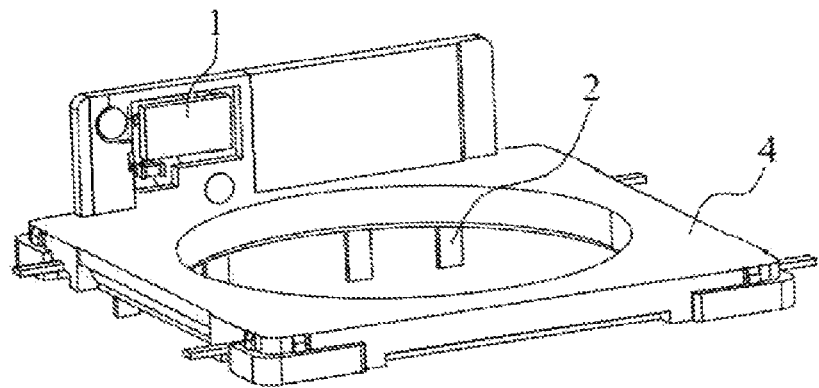
FIG. 1 is a schematic structural diagram of a base with an electronic component provided by an embodiment of the present disclosure.

LIST OF REFERENCE NUMERALS 1. electronic component; 2. metallic circuit; 3. first plastic part; 4. second plastic part; 5. sheet material;
21. branch circuit; 31. limiting block; 51. positioning hole.

DETAILED DESCRIPTION OF THE EMBODIMENTS

The solutions of the present disclosure will be described below in conjunction with the drawings and specific embodiments.

The present embodiment relates to a base with an electronic component. As shown in FIGS. 1 to 5, the base includes an electronic component 1, a metallic circuit 2, a first plastic part 3, and a second plastic part 4.

Figure 2:
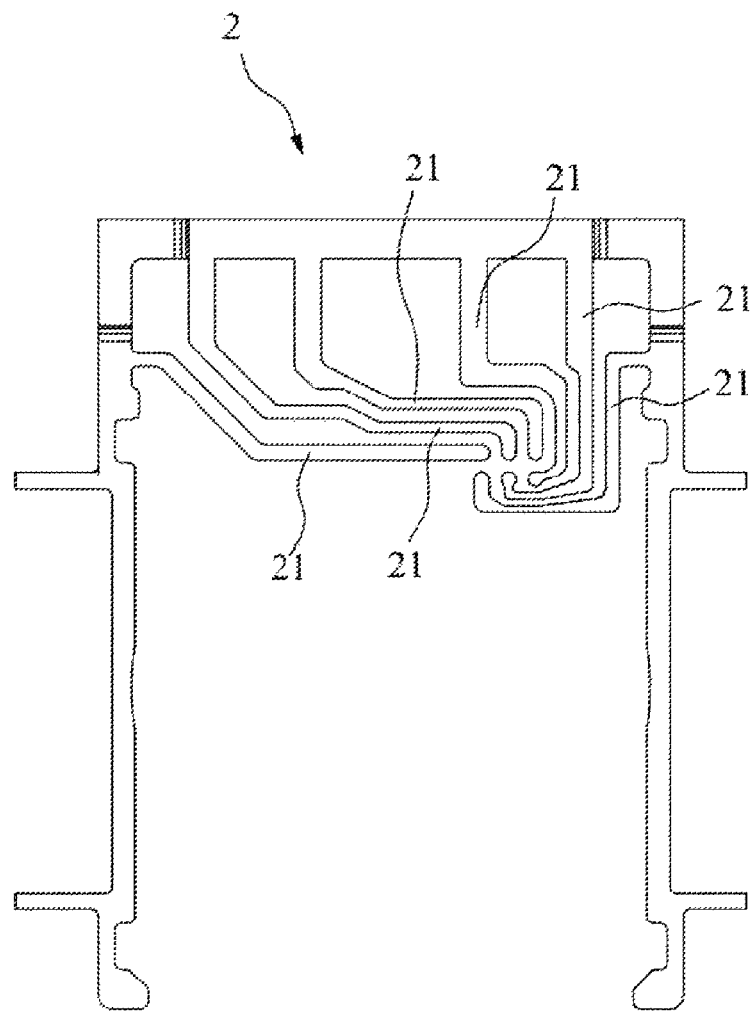
FIG. 2 is a schematic structural diagram of a metallic circuit provided by an embodiment of the present disclosure.

In the present embodiment, the metallic circuit 2 is connected to the electronic component 1. As shown in FIG. 2, the metallic circuit 2 includes a plurality of branch circuits 21, and first ends of the branch circuits 21 are connected to pins of the electronic component 1 in a one-to-one correspondence.

In the present embodiment, the metallic circuit 2 includes a metal substrate and a protective layer. The plurality of branch circuits 21 are made of the metal substrate, and the protective layer covers an outer surface of the metal substrate.

The metal substrate is made of materials such as copper or stainless steel, etc. The thickness of the metal substrate ranges from 0.05 mm to 0.2 mm, for example, it can be selected as 0.06 mm, 0.08 mm, 0.10 mm, 0.11 mm, 0.13 mm, 0.15 mm, 0.16 mm, 0.18 mm or 0.19 mm. The metal base material is stamped from a plate material, and the stamping forming is simple and has high production efficiency. In addition to forming the metal substrate by the stamping forming, other process such as wire cutting can also be adaptively adopted, which are all within the scope of implementation of the present embodiment.

The protective layer includes an anti-oxidation layer and a flux layer that covers an outside of the anti-oxidation layer. The anti-oxidation layer is a nickel layer that prevents the metallic circuit 2 from being oxidized, so as to ensure the service life of the metallic circuit 2. The nickel layer is formed by electroplating. In other embodiments, the metal substrate can be protected by plating other anti-oxidation metals, which can be specifically selected based on actual conditions. At the same time, other surface treatment methods for forming the anti-oxidation layer can also be selected.

The flux layer is a gold layer, a tin layer, or a combination of the gold layer and the tin layer, which is beneficial to improve the welding quality of the electronic component 1 and the metallic circuit 2 when welding. The flux layer is formed by electroplating. Of course, other surface treatment methods for forming the anti-oxidation layer can also be selected.

Figure 3:
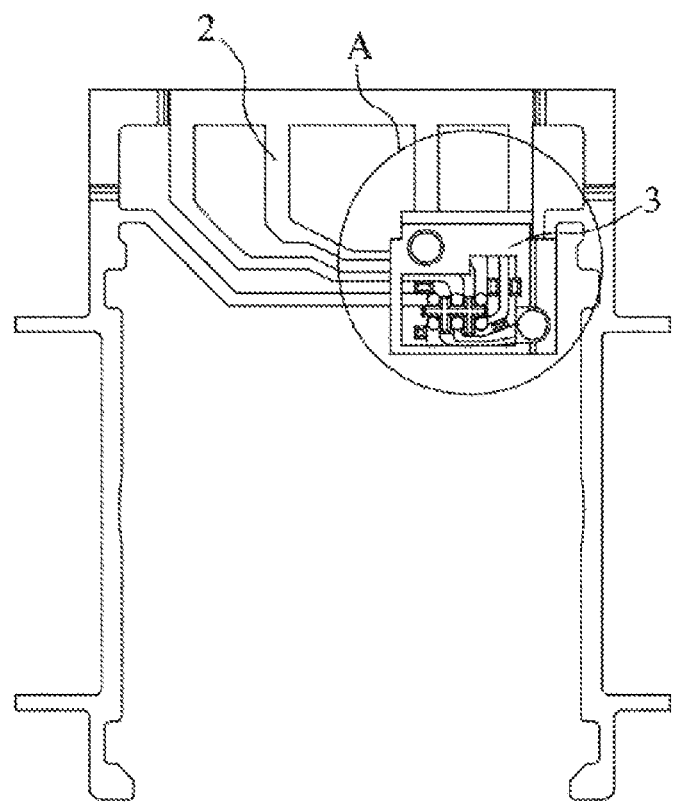
FIG. 3 is a schematic structural diagram of a first plastic part and a metallic circuit provided by an embodiment of the present disclosure.
Figure 4:
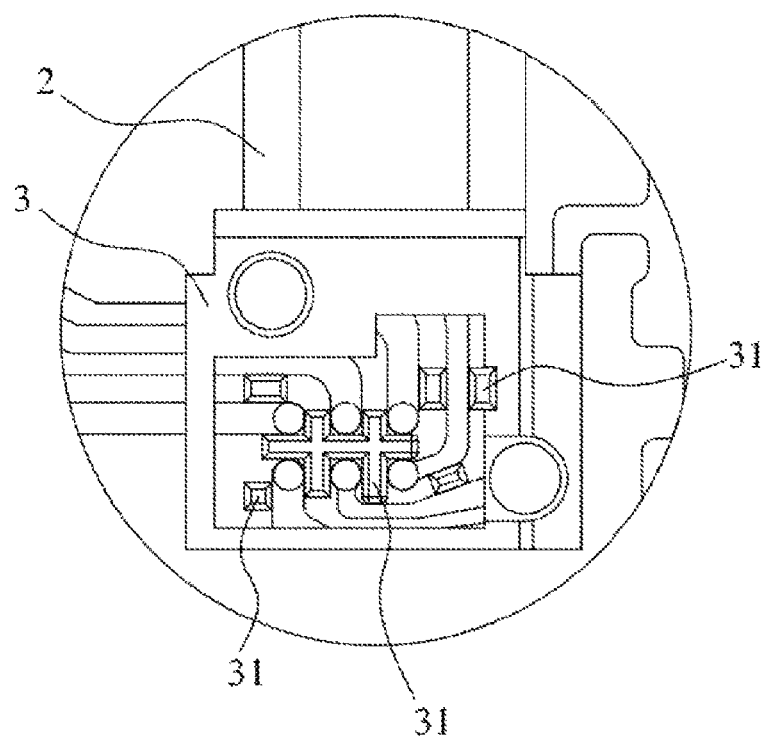
FIG. 4 is a partial enlarged view of a portion A in FIG. 3.

As shown in FIGS. 3 and 4, the first plastic part 3 is located on a position where the metallic circuit 2 and the electronic component 1 are connected, and is configured to connect all the branch circuits 21 of the metallic circuit 2 into one body. The first plastic part 3 includes a plurality of positioning assemblies connected to the plurality of branch circuits 21 in a one-to-one correspondence. Each positioning assembly limits the first end of the corresponding branch circuit 21 connected to the electronic component 1 in at least three different directions, so as to ensure that the first ends of the branch circuits 21 connected to the electronic component 1 are firmly positioned. In an embodiment, each positioning assembly includes at least three limiting blocks 31, and different limiting blocks 31 abut against different positions on the corresponding branch circuit 21, thereby limiting the corresponding branch circuit 21 in at least three different directions. The number of limiting blocks 31 in each positioning assembly can be selected to be three or more, which can be determined according to the shape of the branch circuit 21.

Since each branch circuit 21 of the metallic circuit 2 is connected to the electronic component 1, in the case of the small size of the electronic component 1, the distance between adjacent branch circuits 21 is small, and the limiting blocks 31 corresponding to different branch circuits 21 can be shared or connected as a whole, thereby enhancing the effect of stably supporting the branch circuit 21 and ensuring the stability of the metallic circuit 2.

As shown in FIG. 1, the second plastic part 4 wraps the metallic circuit 2, and a second end of the branch circuit 21 of the metallic circuit 2 away from the electronic component 1 extends out of the second plastic part 4, and the second plastic part 4 can protect the metallic circuit 2. At the same time, the second end of the branch circuit 21 of the metallic circuit 2 away from the electronic component 1 is located outside the second plastic part 4 to realize the connection with an external circuit, so that the electronic component 1 can realize its own function. The shape and structure of the second plastic part 4 can be adaptively selected according to specific use occasions, which are not specifically limited hereto.

In the present embodiment, the first plastic part 3 and the second plastic part 4 are integrally formed with the metallic circuit 2 by injection molding. There is no need to produce the metallic circuit 2, the first plastic part 3, and the second plastic part 4 individually, and there is no need to perform an assembly process afterwards, thereby simplifying the assembly process and improving the production efficiency of the base.

In the base with the electronic component of the present embodiment, FPC is replaced by the metallic circuit 2, so that there is no need to produce FPC, which simplifies the production process of the base and reduces the material cost. At the same time, in order to ensure the stability of the metallic circuit 2 during the production process of the base, all the branch circuits 21 of the metallic circuit 2 are connected through the first plastic part 3 to realize the connection and reinforcement of the plurality of branch circuits 21 of the metallic circuit 2, thereby obtaining the base with high quality.

The electronic component 1 and the metallic circuit 2 are welded by SMT, which can improve the welding efficiency.

The present embodiment further relates to a voice coil motor including the above-mentioned base with the electronic component, and the electronic component 1 is a Hall element. The production process and the cost of the base with the electronic component are simplified and reduced, respectively, so that it is beneficial to simplify the assembly process of the voice coil motor and improve the production efficiency of the voice coil motor.

Figure 6:
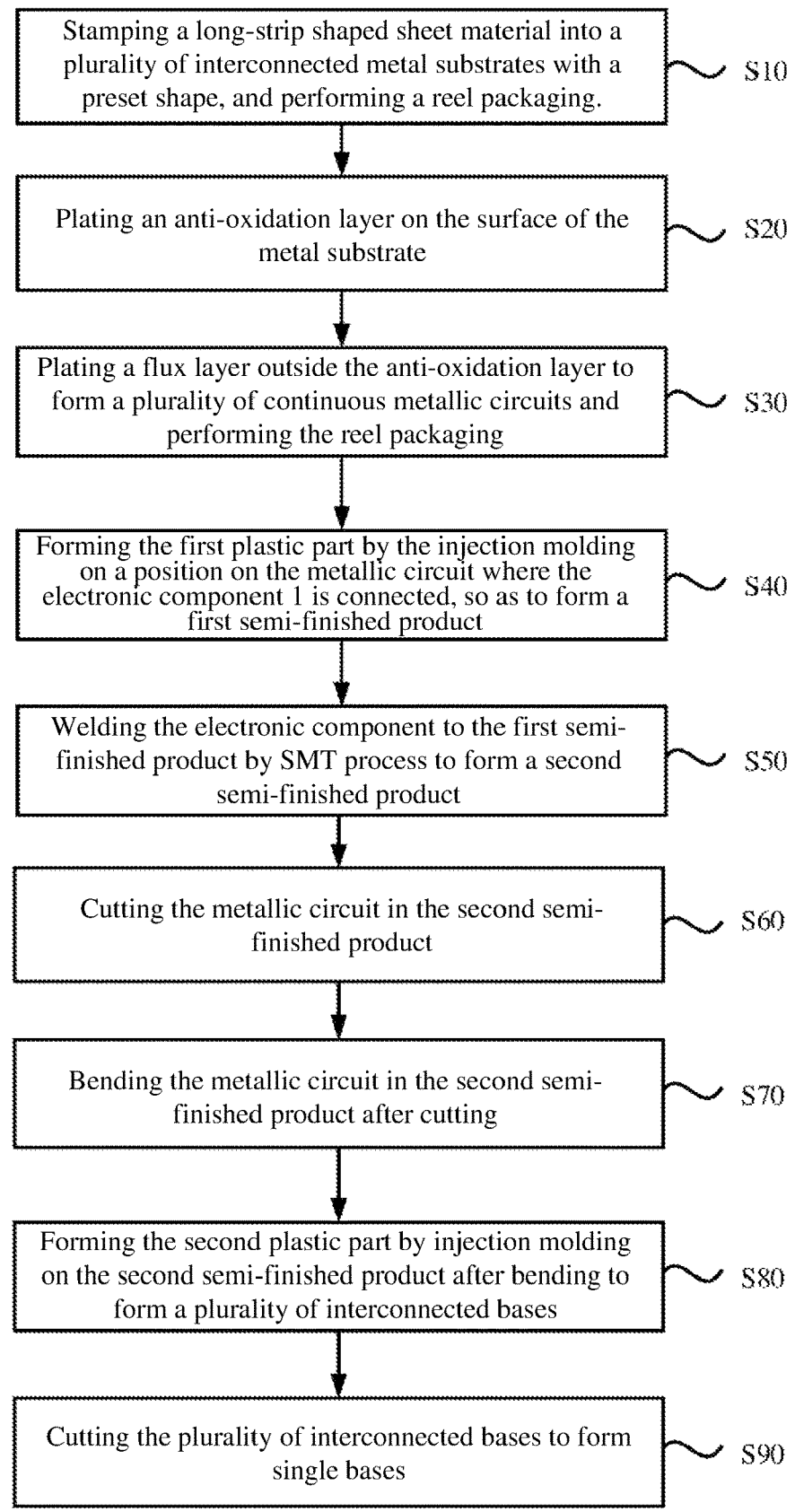
FIG. 6 is a flow chart of production process of a base with an electronic component provided by an embodiment of the present disclosure.
Figure 7:
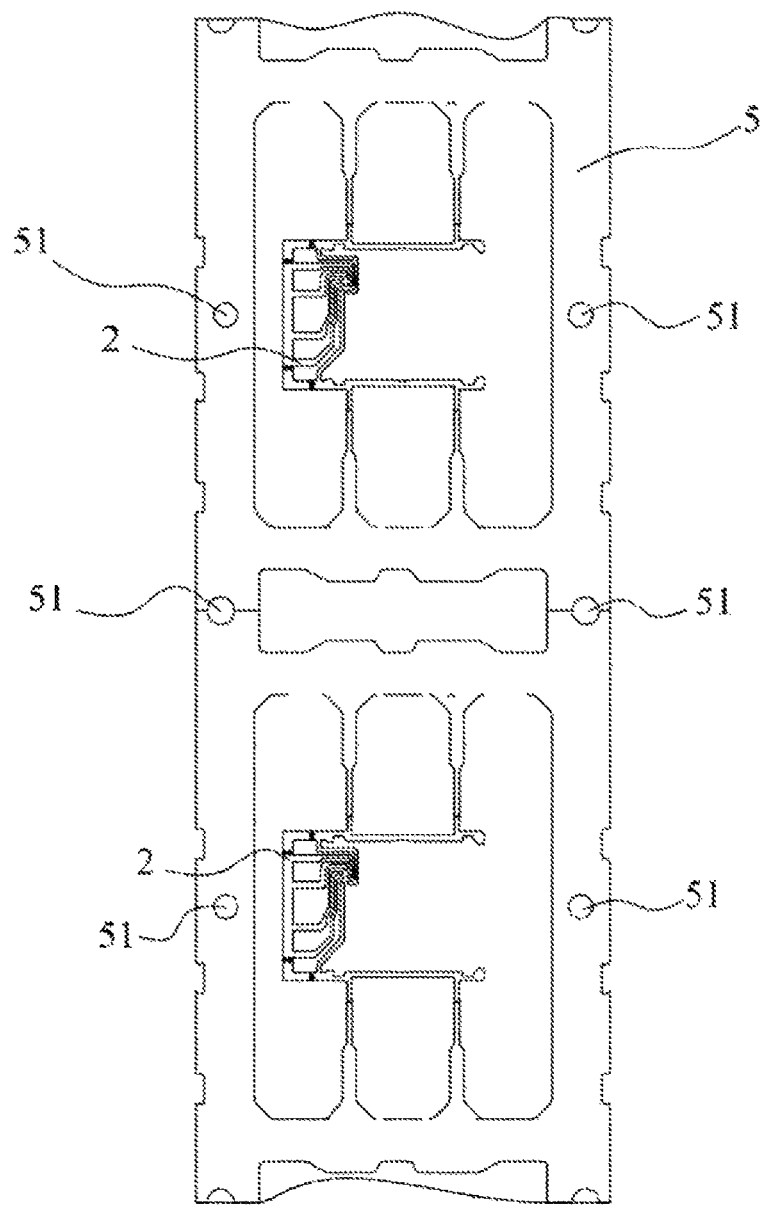
FIG. 7 is a schematic structural diagram of a plurality of interconnected metal substrates provided by an embodiment of the present disclosure.

The present embodiment further relates to a production process of a base with an electronic component, as shown in FIGS. 6 and 7, the production process includes the following steps.

S10, a long-strip shaped sheet material 5 is stamped into a plurality of interconnected metal substrates with a preset shape, and a reel packaging is performed.

In a traditional spot-tin welding process, the electronic component 1 is welding to the FPC by spot welding. Therefore, it is necessary to perform repeated positioning for each FPC, and it has a high requirement for the accuracy of the repeated positioning for the FPC. In the actual production process, the accuracy of each positioning cannot be fully guaranteed. At the same time, FPC itself has geometric tolerances. Based on the above situation, the overall defect rate of the base produced by the assembly process is high, and welding after positioning one by one leads to a low production efficiency and a poor mass production.

In step S10, by stamping a plurality of interconnected metal substrates on the long-strip shaped sheet material 5, a continuous production or mass production can be realized in subsequent multiple steps, which is beneficial to improve production efficiency. As shown in FIG. 7, in this step, a plurality of positioning holes 51 are also stamped and formed on the long-strip shaped sheet material 5. In the subsequent multiple process steps, the sheet material 5 can be positioned by positioning pins penetrating the positioning holes 51, thereby realizing a simultaneous positioning for a plurality of metal substrates, and avoiding the problem of low efficiency caused by the repeated positioning one by one. In the present embodiment, the positioning pins are arranged on a forming device in the corresponding process. In the present embodiment, in addition to forming the metal substrate by the stamping forming, other process such as wire cutting can also be adaptively adopted, which are all within the scope of implementation of the present embodiment.

In the present embodiment, the long-strip shaped sheet material 5 is made of materials such as copper or stainless steel, etc. In other embodiments, according to specific conditions, the long-strip shaped sheet material 5 may also be selected as a long-strip shaped sheet material of other metals or alloys, as long as it capable of conducting electricity and being welded to the electronic component 1. The thickness of the long-strip shaped sheet material ranges from 0.05 mm to 0.2 mm, for example, it can be selected as 0.06 mm, 0.08 mm, 0.10 mm, 0.11 mm, 0.13 mm, 0.15 mm, 0.16 mm, 0.18 mm or 0.19 mm.

The metal substrate is treated by the reel packaging. When processing in the next step, the reel can be driven to rotate by an automatic traction device or a feeding device, which is beneficial to realize automatic feeding.

S20, an anti-oxidation layer is plated on the surface of the metal substrate.

In an embodiment, the anti-oxidation layer is formed by plating nickel to prevent the metallic circuit 2 from being oxidized, so as to ensure the service life of the metallic circuit 2. In other embodiments, the metal substrate can be protected by plating other anti-oxidation metals, which can be specifically selected based on actual conditions; at the same time, other surface treatment methods for forming the anti-oxidation layer can also be selected.

S30, a flux layer is plated outside the anti-oxidation layer to form a plurality of continuous metallic circuits 2 and the reel packaging is performed.

In an embodiment, the flux layer is formed by plating gold or tin outside the anti-oxidation layer, or by plating both gold and tin to achieve a better flux effect. The flux layer facilitates the welding process, so that it can improve the welding quality when the metallic circuit 2 and the electronic component 1 are welded to each other.

The formed metallic circuit 2 is treated by the reel packaging. When processing in the next step, the reel can be driven to rotate by an automatic traction device or a feeding device, which is beneficial to realize automatic feeding.

S40, the first plastic part is formed by the injection molding on a position on the metallic circuit 2 where the electronic component 1 is connected, so as to form a first semi-finished product, as shown in FIGS. 3 and 4.

In an embodiment, when performing the injection molding, the injection temperature ranges from 250 degrees Celsius (° C.) to 390 degrees Celsius (° C.), for example, it can be selected as 260° C., 270° C., 280° C., 290° C., 300° C., 310° C., 320° C., 330° C., 340° C., 350° C., 360° C., 370° C. or 380° C. The injection time ranges from 5 seconds (s) to 15 seconds (s), for example, it can be selected as 6 s, 7 s, 8 s, 9 s, 10 s, 11 s, 12 s, 13 s or 14 s.

Figure 5:
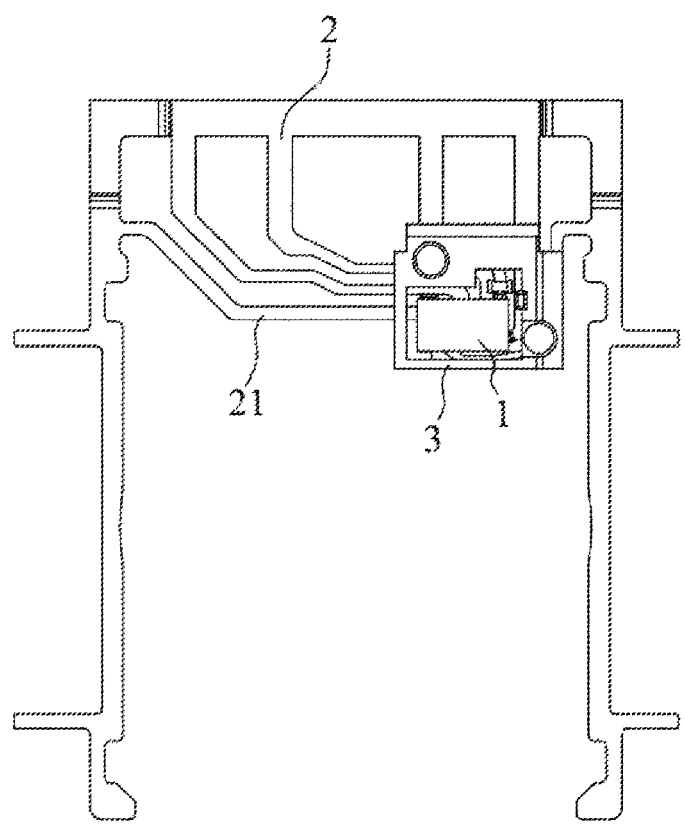
FIG. 5 is a schematic structural diagram of a metallic circuit with a Hall element welded thereon provided by an embodiment of the present disclosure.

S50, the electronic component 1 is welded to the first semi-finished product by SMT process to form a second semi-finished product, as shown in FIG. 5.

In an embodiment, the welding temperature of the SMT process ranges from 150° C. to 350° C., for example, it can be selected as 160° C., 170° C., 180° C., 190° C., 200° C., 210° C., 220° C., 230° C., 240° C., 250° C., 260° C., 270° C., 280° C., 290° C., 300° C., 310° C., 320° C., 330° C., 340° C. or 350° C.

Figure 8:
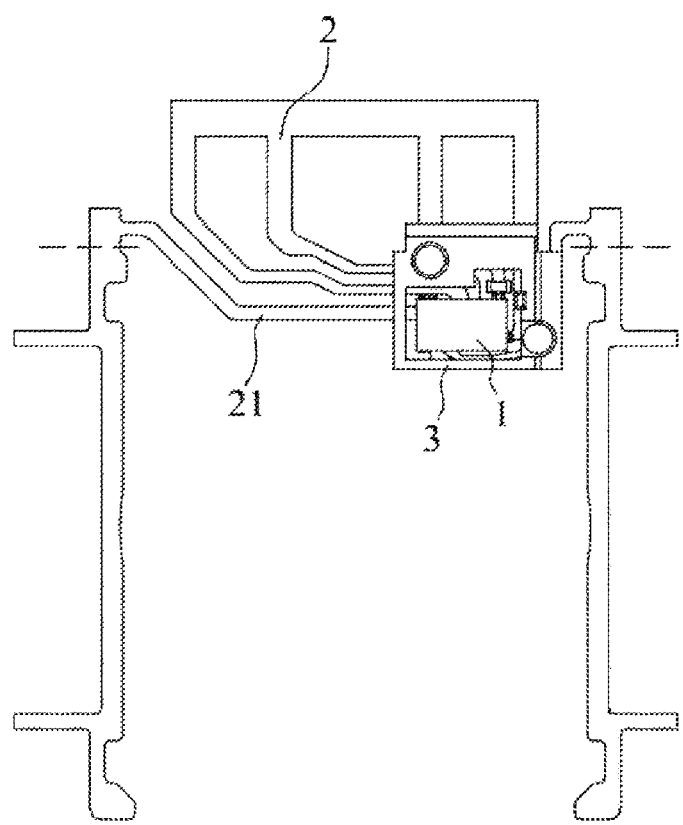
FIG. 8 is a schematic structural diagram of a metallic circuit after being cut provided by an embodiment of the present disclosure.

S60, the metallic circuit 2 in the second semi-finished product is cut, as shown in FIG. 8.

S70, the metallic circuit 2 in the second semi-finished product after cutting is bent.

In an embodiment, at the position marked with dotted lines in FIG. 8, the bending is carried out along the dotted lines.

S80, the second plastic part 4 is formed by injection molding on the second semi-finished product after bending to form a plurality of interconnected bases.

The injection temperature ranges from 250° C. to 390° C., for example, it can be selected as 260° C., 270° C., 280° C., 290° C., 300° C., 310° C., 320° C., 330° C., 340° C., 350° C., 360° C., 370° C. or 380° C. The injection time ranges from 5 s to 15 s, for example, it can be selected as 6 s, 7 s, 8 s, 9 s, 10 s, 11 s, 12 s, 13 s or 14 s.

S90, the plurality of interconnected bases are cut to form single bases, as shown in FIG. 1, which facilitates the assembly of the bases into the corresponding voice coil closed-loop motor one by one.

In an embodiment, this step includes cutting a material band of the long-strip shaped sheet material 5 connected to the plurality of bases, and further includes cutting off connecting parts in each metallic circuit connected to the different branch circuits 21. A cutting machine used in this step has functions of cutting off the material band and cavity dividing, which can cut a plurality of interconnected bases into a plurality of single bases at one time, thereby improving the work efficiency.

What is claimed is:
1. A production process of a base with an electronic component, comprising the steps of:
  stamping a metallic circuit with a plurality of branch circuits;
  integrally forming a first plastic part by injection molding on the metallic circuit so as to form a first semi-finished product;
  connecting the electronic component with the branch circuit respectively on the first semi-finished product so as to form a second semi-finished product; and
  integrally forming a second plastic part by injection molding on the second semi-finished product;
  wherein the first plastic part is in a first horizontal position when being integrally formed with the metallic circuit by injection molding to form the first semi-finished product, and the electronic component is also in the first horizontal position when being connected to the branch circuit respectively on the first semi-finished product so as to form a second semi-finished product; the production process further comprising a step of bending the metallic circuit of the second semi-finished product so as to transfer the first plastic part and the electronic component from the first horizontal position to a second vertical position.

2. The production process of the base with the electronic component of claim 1, wherein the second plastic part is integrally formed with and at least partially surrounded the first plastic part.

3. The production process of the base with the electronic component of claim 2, wherein the second plastic part is at least surrounded two lateral sides and a bottom side of the first plastic part.

4. The production process of the base with the electronic component of claim 1, wherein the electronic component is connected with the branch circuit of the metallic circuit via welding of Surface Mount Technology.

5. The production process of the base with the electronic component of claim 1, wherein the first plastic part forms a plurality of positioning assemblies connected to the plurality of branch circuits in a one-to-one correspondence, and each positioning assembly is configured to limit the first end of the corresponding branch circuit connected to the electronic component in at least three different directions.

6. The production process of the base with the electronic component of claim 5, wherein each positioning assembly comprises at least three limiting blocks, and different limiting blocks abut against different positions on the corresponding branch circuit.

7. The production process of the base with the electronic component of claim 1, wherein the step of stamping a metallic circuit with a plurality of branch circuits comprises:
stamping a long-strip shaped sheet material into a plurality of interconnected metal substrates with a preset shape.

8. The production process of the base with the electronic component of claim 7, wherein prior to the step of integrally forming a first plastic part by injection molding on the metallic circuit so as to form a first semi-finished product, the production process of the base with the electronic component further comprises:
performing a reel packaging of the plurality of interconnected metal substrates; and
driving the reel packaging of the plurality of interconnected metal substrates to rotate by an automatic traction device or a feeding device.

9. The production process of the base with the electronic component of claim 7, wherein prior to the step of integrally forming a first plastic part by injection molding on the metallic circuit so as to form a first semi-finished product, the production process of the base with the electronic component further comprises:
plating an anti-oxidation layer on the surface of the metal substrate.

10. The production process of the base with the electronic component of claim 7, wherein a thickness of the long-strip shaped sheet material ranges from 0.05 mm to 0.2 mm.

11. The production process of the base with the electronic component of claim 7, wherein prior to the step of bending the metallic circuit of the second semi-finished product, the production process of the base with the electronic component further comprises:
cutting the metallic circuit in the second semi-finished product, so as to form a plurality of interconnected bases when the second plastic part is formed by injection molding on the second semi-finished product after bending; and
after the step of bending the metallic circuit of the second semi-finished product, the production process of the base with the electronic component further comprises:
cutting the plurality of interconnected bases to form single bases.

12. The production process of the base with the electronic component of claim 1, wherein when performing the injection molding, an injection temperature ranges from 250 degrees Celsius to 390 degrees Celsius.

13. A production process of a base with an electronic component configured to vertically integrate the electronic component on the base, comprising the steps of:
forming a metallic circuit, wherein the metallic circuit comprises a plurality of branch circuits horizontally arranged to be connected to the electronic element;
performing injection molding at positions where the plurality of branch circuits are connected to the electronic element to form a first plastic part, so as to form a first semi-finished product, the first plastic part horizontally arranged and providing with an accommodating groove, and the plurality of branch circuits being exposed to the accommodating groove;
arranging the electronic component horizontally on the first plastic part and accommodating the electronic component in the accommodating groove, and welding pins of the electronic component to the plurality of branch circuits to form a second semi-finished product;
bending the metallic circuit of the second semi-finished product, wherein after the bending, converting the first plastic part and the electronic element simultaneously from a horizontal position to a vertical position; and
performing injection molding on the second semi-finished product to form a second plastic part, so as to form the base integrating the metallic circuit, the electronic component vertically arranged, the first plastic part and the second plastic part.

14. The production process of the base with the electronic component of claim 13, wherein the pins of the electronic component are welded to the plurality of branch circuits through Surface Mount Technology, and the second plastic part is wrapped on the metallic circuit, ends of the plurality of branch circuits away from the electronic component extend out of the second plastic part to be connected to an external circuit.

15. The production process of the base with the electronic component of claim 13, wherein the base is used in a motor of a camera module, and the electronic element is a Hall element.

16. The production process of the base with the electronic component of claim 13, wherein the first plastic part is formed with a plurality of positioning assemblies connected to the plurality of branch circuits in a one-to-one correspondence, and each positioning assembly is configured to limit an end of the corresponding branch circuit connected to the electronic component in at least three different directions.

17. The production process of the base with the electronic component of claim 16, wherein each positioning assembly comprises at least three limiting blocks, and different limiting blocks abut against different positions on the corresponding branch circuit.

18. The production process of the base with the electronic component of claim 13, wherein the second plastic part is integrally formed with and at least partially surrounded the first plastic part, and the electronic component is simultaneously exposed to the first plastic part and the second plastic part.

* * * * *